(12) United States Patent
Maccario et al.

(10) Patent No.: US 11,810,992 B2
(45) Date of Patent: Nov. 7, 2023

(54) PHOTOVOLTAIC MODULE WITH ENHANCED LIGHT COLLECTION

(71) Applicant: Silfab Solar Inc., Mississauga (CA)

(72) Inventors: Paolo Maccario, Oakville (CA); Mark Rossetto, Padua (IT); Maurizio Pesce, Tosatti (IT)

(73) Assignee: Silfab Solar Inc., Mississauga (CA)

( * ) Notice: Subject to any disclaimer, the term of this patent is extended or adjusted under 35 U.S.C. 154(b) by 0 days.

(21) Appl. No.: 16/981,504

(22) PCT Filed: Mar. 18, 2019

(86) PCT No.: PCT/CA2019/050330
§ 371 (c)(1),
(2) Date: Sep. 16, 2020

(87) PCT Pub. No.: WO2019/173928
PCT Pub. Date: Sep. 19, 2019

(65) Prior Publication Data
US 2021/0013355 A1    Jan. 14, 2021

Related U.S. Application Data

(60) Provisional application No. 62/644,256, filed on Mar. 16, 2018, provisional application No. 62/644,268, filed on Mar. 16, 2018.

(51) Int. Cl.
*H01L 31/054* (2014.01)
*H01L 31/05* (2014.01)
*H01L 31/048* (2014.01)

(52) U.S. Cl.
CPC ...... *H01L 31/0547* (2014.12); *H01L 31/0488* (2013.01); *H01L 31/0516* (2013.01)

(58) Field of Classification Search
CPC .... H02S 40/22; H01L 31/0547; H01L 31/042
See application file for complete search history.

(56) References Cited

U.S. PATENT DOCUMENTS

| | | |
|---|---|---|
| 4,235,643 A | 11/1980 | Amick |
| 5,994,614 A | 11/1999 | Kardauskas |
| 2008/0000517 A1* | 1/2008 | Gonsiorawski ....... H01L 31/048 136/246 |
| 2008/0236655 A1 | 10/2008 | Bladwin et al. |
| 2009/0178704 A1 | 7/2009 | Kalejs et al. |
| 2013/0340804 A1* | 12/2013 | Moon ................. H01L 31/0508 136/244 |
| 2014/0102515 A1 | 4/2014 | Sakuma et al. |
| 2014/0116495 A1 | 5/2014 | Kim et al. |
| 2015/0207003 A1* | 7/2015 | Woo .................... H01L 31/0516 136/256 |
| 2017/0365727 A1* | 12/2017 | Ishiguro ............ H01L 31/02366 |
| 2018/0013025 A1* | 1/2018 | Iwata ................. H01L 31/0547 |

OTHER PUBLICATIONS

International Search Report and Written Opinion from counterpart PCT International Appln. No. PCT/CA2019/050330 dated May 24, 2019.

* cited by examiner

*Primary Examiner* — Christina Chern
(74) *Attorney, Agent, or Firm* — DLA Piper LLP (US)

(57) ABSTRACT

The present invention is applied to photo voltaic module enhanced light. In particular, the present invention relates to glass-glass and back contact photo photovoltaic modules with enhanced conversion efficiency in areas that are not usually active.

6 Claims, 6 Drawing Sheets

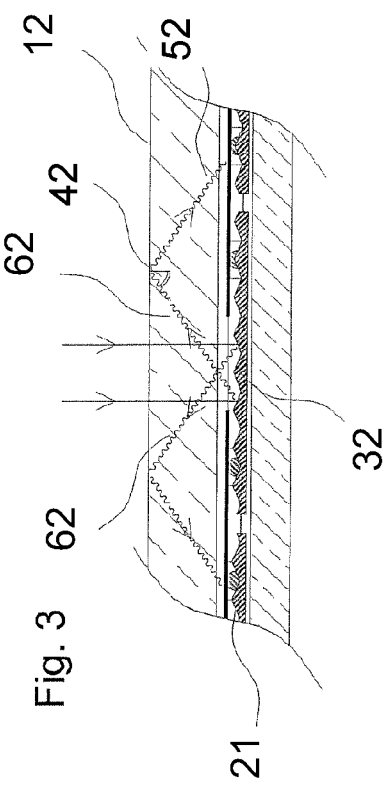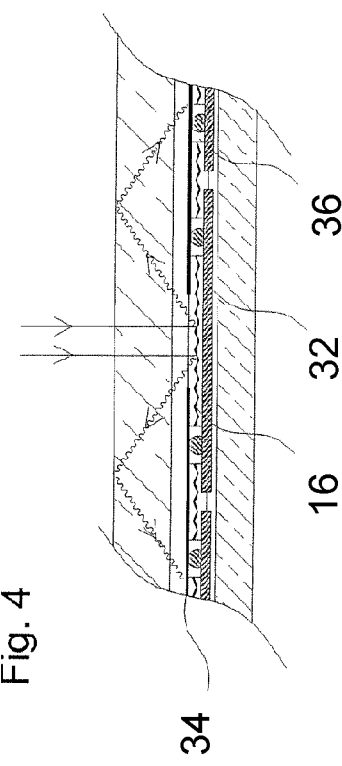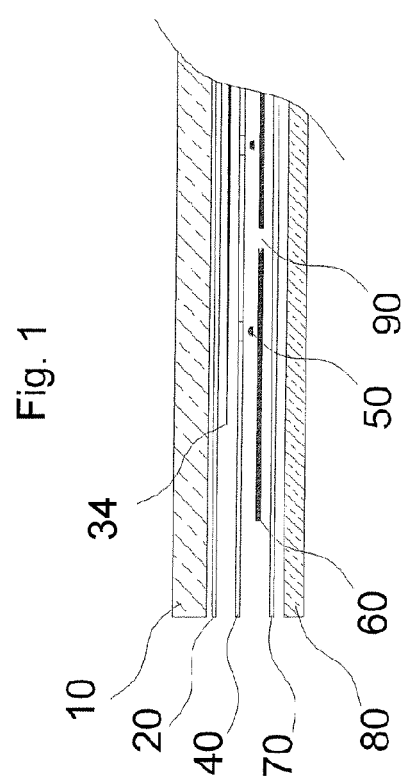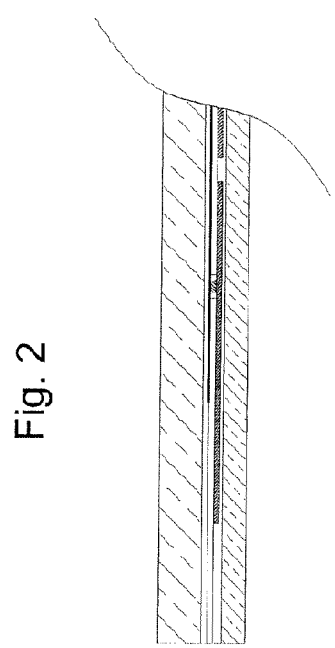

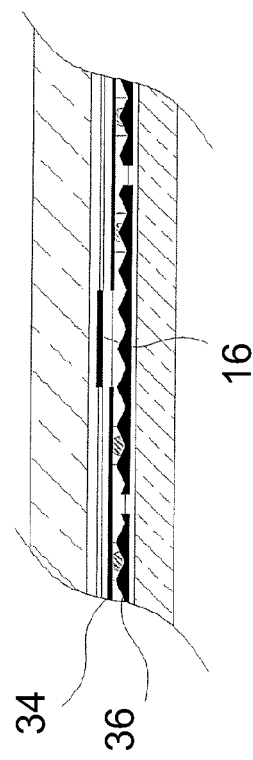
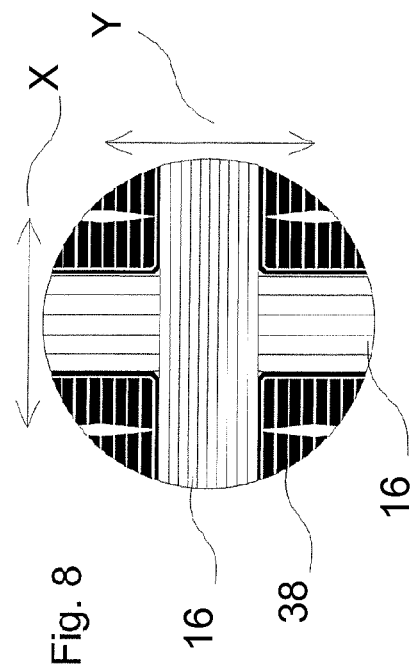
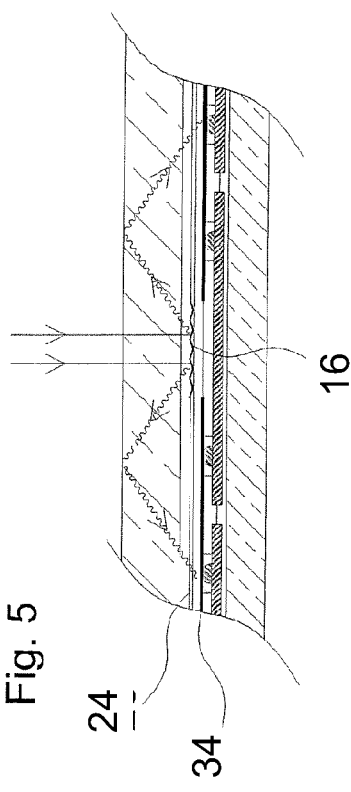
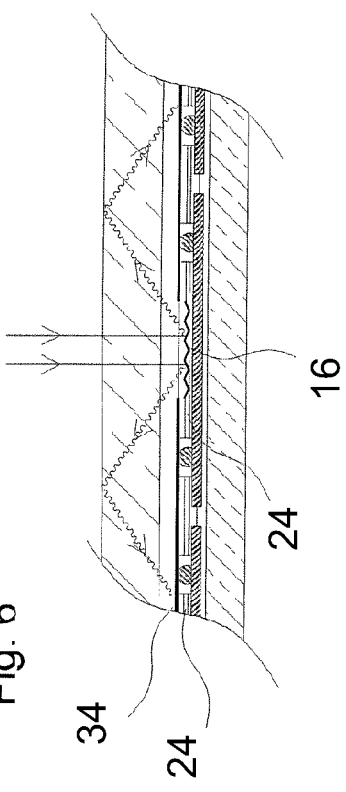

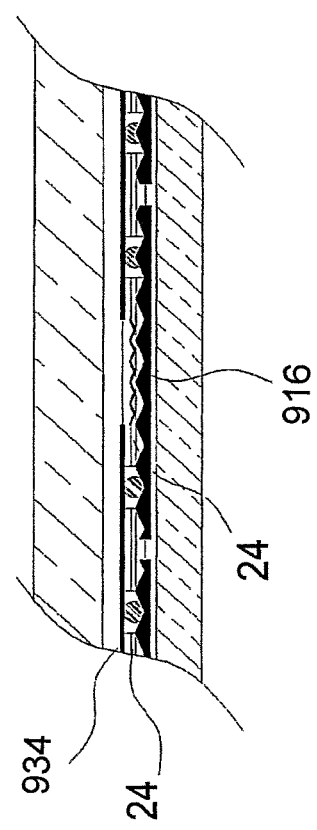

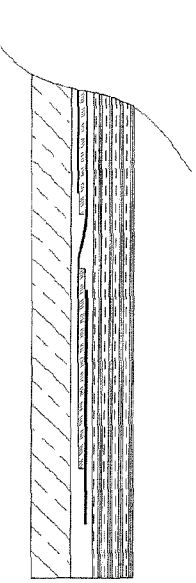
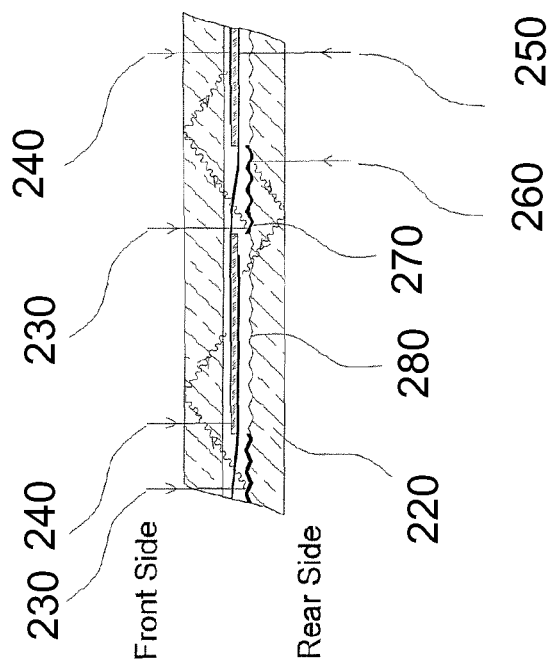
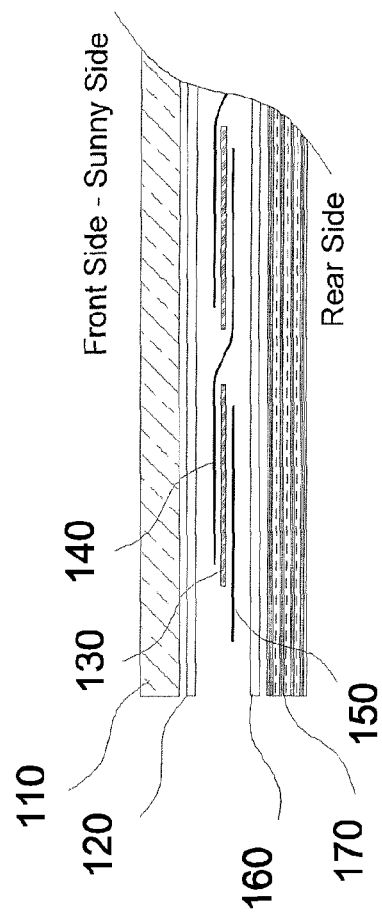
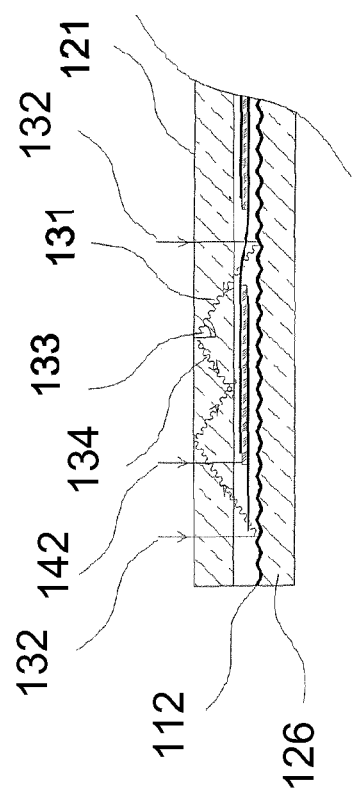

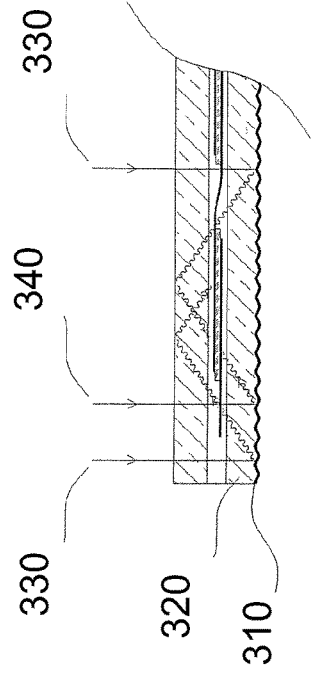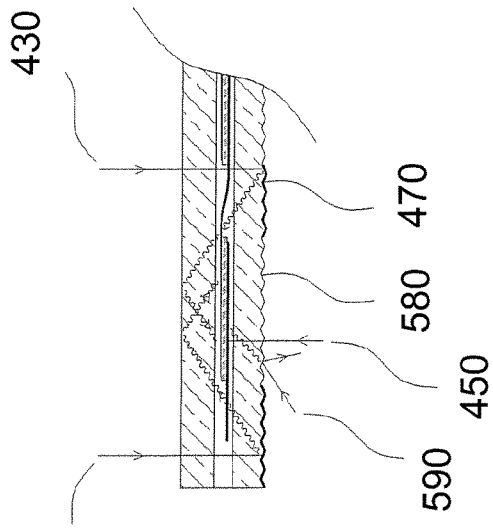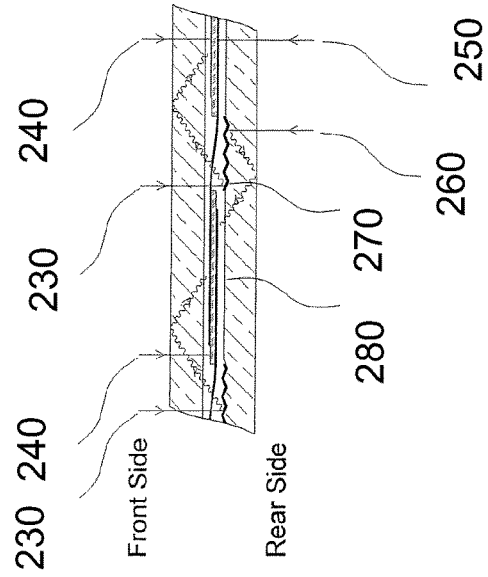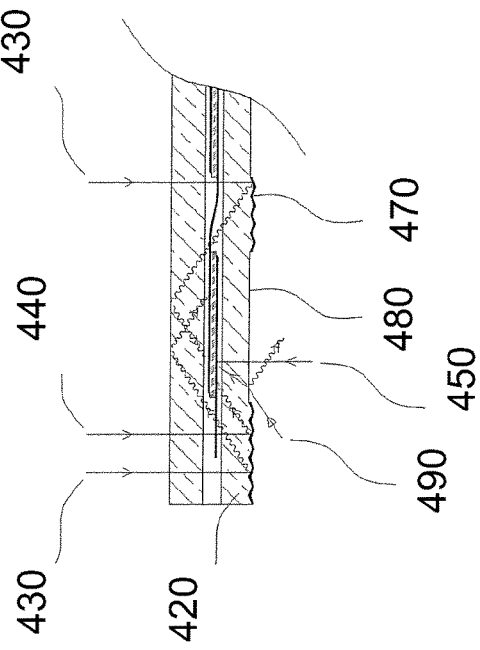

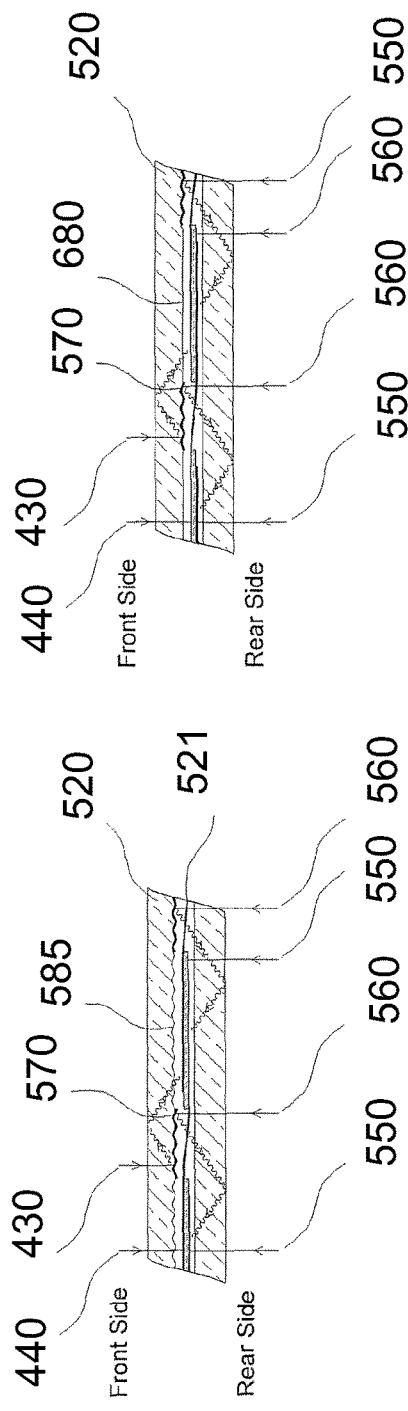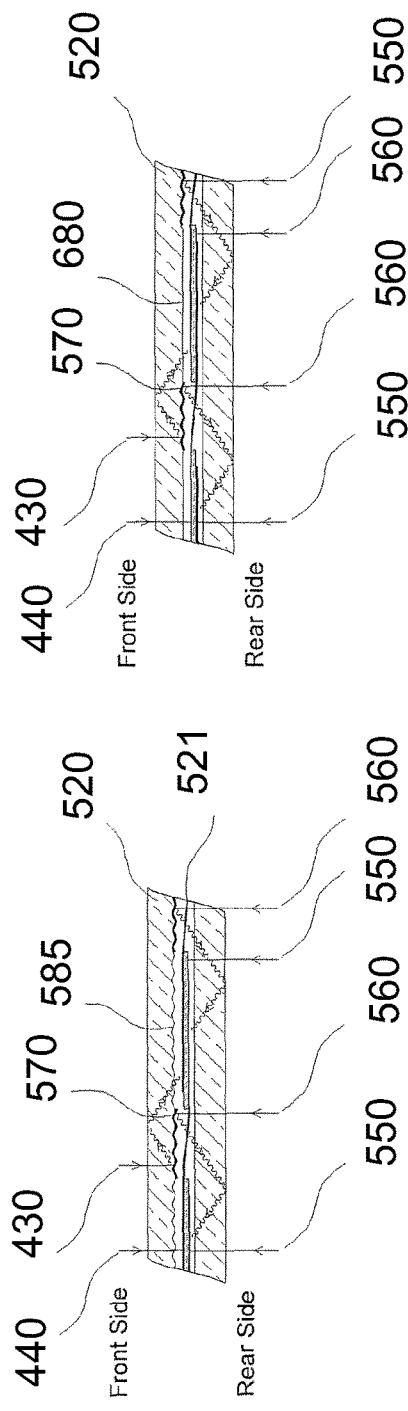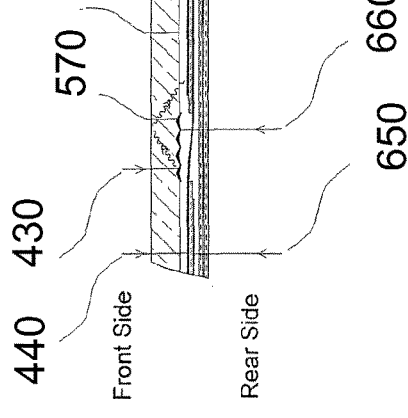

PHOTOVOLTAIC MODULE WITH ENHANCED LIGHT COLLECTION

FIELD

This disclosure relates generally to photovoltaic modules with monofacial or bifacial cells. In particular, this disclosure relates to photovoltaic modules with enhanced conversion efficiency in areas that are not usually active.

BACKGROUND ART

There are different types of photovoltaic (or PV) modules, with various technical configurations.

One such configuration includes the use of solar cells with both electrical contacts (positive and negative pole) on the same side (usually the back side). A benefit of this type of module, known as a back contact module, is the positioning of the electrical interconnections in the side not directly exposed to sunlight, allowing for a conductive cross-section higher than traditional modules. An electrical connection placed in both sides of the cells requires a compromise between electrical conductivity and shading of the cells.

A back contact module is known to achieve greater efficiencies due to the lower shading of the cells and the lower resistive losses. In such modules, the electrical interconnection may be established by conductive ribbon, conductive wires, or conductive sheets. However, the presence of both electrical contacts on the same side increases the risk of accidental short circuit formation during the production of the modules. As a result, in some instances it is necessary to selectively insulate the two polarities of the cell by applying dielectric layers.

Another configuration includes the use of a solar back sheet based entirely on polymeric materials. This configuration typically requires low production costs, notwithstanding that it doesn't guarantee an effective protection against moisture ingress. Over prolonged use, water vapor molecules may penetrate between the polymer chains of the back sheet reaching the solar cells and inducing oxidation reactions that reduce the electrical performance of the solar cells.

Furthermore, the polymer chains exposed to atmospheric agents undergo degradation that may reduce their insulation properties during the life cycle of the solar module. The decay of the mechanical properties with consequent absorption of humidity must be carefully evaluated by the producers of PV modules to predict the maximum decay over time and define the conditions of the warranty. Usually the PV modules are guaranteed for 20-25 years with a decay not higher than 15% of the nominal power at the end of the last year and an established maximum loss expected for each year of life (after a greater loss during the first year of life, a linear decay is expected for the remaining years covered by the warranty).

To minimize the risk of water vapour entry into the back or rear side of the module, the back sheet may be replaced by a glass. The molecular structure of the glass is used to block the ingress of water molecules and thereby tending to lower efficiency losses in the life span of the solar module. The higher productivity of the module over its useful life is counterbalanced by a higher production cost (glass is more expensive than the polymer back sheet) and usually has a greater weight (a significant factor in some types of installation).

The PV modules with a glass sheet on both sides, known as glass-glass modules, are more expensive than modules based on polymeric back sheet and the higher cost limits the adoption in the market despite the better performance over time.

In back contact modules and back sheet PV modules, there are inactive areas between the cells and between the cells and the edge of the module that are not electrically active. It would be advantageous to capture part of the light received by the inactive areas to improve efficiency by minimizing the area of the module that is not electrically active and lowering losses caused by the absorption of glass and encapsulating materials.

DESCRIPTION OF THE DRAWINGS

In the following detailed description of the invention, reference is made to the accompanying drawings that form a part hereof, and in which are shown, by way of illustration, specific embodiments in which the invention may be practiced. These embodiments are described in sufficient detail to enable those skilled in the art to practice the invention. Other embodiments may be utilized, and structural, logical, and electrical changes may be made, without departing from the scope of the present invention.

FIG. 1 is an exploded view of a common structure for a back contact PV module.

FIG. 2 is a side view of a common structure of a back contact PV module after lamination.

FIG. 3 is a side view of an embodiment wherein a reflective layer is used to interconnect the cells matrix.

FIG. 4 is a side view of an embodiment wherein a reflective layer is placed between the cells matrix and the conductive layer, the reflective layer is locally opened to establish the electrical connection.

FIG. 5 is a side view of an embodiment wherein one or several reflective layers are coupled with one or several polymeric layers placed above the cells matrix.

FIG. 6 is a side view of an embodiment wherein one or several reflective layers are coupled with one or several polymeric layers placed between the cells matrix and the conductive layer.

FIG. 7 is a side view of an embodiment wherein a reflective layer of FIG. 5 is used in combination with a conductive layer of FIG. 3.

FIG. 8 is a front view of an embodiment wherein a reflective layer of FIG. 5 is used in combination with a conductive layer of FIG. 3.

FIG. 9 is a side view of an embodiment wherein a reflective layer of FIG. 6 is used in combination with a conductive layer of FIG. 3.

FIG. 10 is an exploded view of a common structure for a PV module.

FIG. 11 is a side view of a common structure of a PV module after lamination.

FIG. 12 is a side view of an embodiment wherein the inner surface of the rear glass has a sawtooth profile with a reflective layer.

FIG. 13 is a side view of an embodiment wherein the inner surface of the rear glass has a sawtooth profile with a reflective layer in specific areas.

FIG. 14 is a side view of an embodiment wherein the inner surface of the rear glass has a sawtooth profile with a reflective layer in specific areas, while the transparent areas are flat or pseudo flat.

FIG. 15 is a side view of an embodiment wherein the outer surface of the rear glass has a sawtooth profile with a reflective layer.

FIG. 16 is a side view of an embodiment wherein the outer surface of the rear glass has a sawtooth profile with a reflective layer in specific areas, while the transparent areas are flat or pseudo flat.

FIG. 17 is a side view of an embodiment wherein the outer surface of the rear glass has a sawtooth profile with a reflective layer in specific areas.

FIG. 18 is a side view of an embodiment wherein the inner surface of the front glass has a sawtooth profile with a reflective layer in specific areas.

FIG. 19 is a side view of an embodiment wherein the inner surface of the front glass has a sawtooth profile with a reflective layer in specific areas, while the transparent areas are flat or pseudo flat.

FIG. 20 is a side view of an embodiment wherein the inner surface of the front glass has a sawtooth profile with a reflective layer in specific areas, while the transparent areas are flat or pseudo flat and a polymeric back sheet is used as rear encapsulant layer.

FIG. 21 is a side view of an embodiment wherein the inner surface of the front glass has a sawtooth profile with a reflective layer in specific areas and a polymeric back sheet is used as rear encapsulant layer.

SUMMARY

A glass-glass photovoltaic module is provided comprising a front glass layer, a rear glass layer, at least one solar cell, at least one reflective surface for redirecting light to the at least one solar cell.

A glass-glass photovoltaic module is also provided comprising a front surface comprised of a front glass layer, a back surface comprised of a rear glass layer, at least an encapsulating layer between the transparent front support layer and at least one solar cell, the at least one solar cell comprising a front side and a back side, electrical connections on the front side and rear side of the at least one solar cell, at least a second encapsulating layer between the at least one solar cell and the rear glass, and at least one reflective surface disposed at least partially in the interstitial space adjacent to the at least one solar cell for redirecting light to the at least one solar cell.

A photovoltaic module is provided comprising a front surface comprised of a front glass layer, a back surface, at least an encapsulating layer between the transparent front support layer and at least one solar cell, the at least one solar cell comprising a front side and a back side, electrical connections on the front side and rear side of the at least one solar cell, at least a second encapsulating layer between the at least one solar cell and the rear glass, and at least one reflective surface disposed at least partially in the interstitial space adjacent to the at least one solar cell for redirecting light to the at least one solar cell.

Further provided is a photovoltaic module with back contact cells comprising a front support layer, at least one solar cell, at least one reflective layer behind the front support layer, the at least one reflective layer comprising a surface for redirecting light to the at least one solar cell.

Further provided is a photovoltaic module comprising a front surface comprised of a transparent front support layer, a back surface comprised of a back protective layer, at least an encapsulating layer between the transparent front support layer and at least one solar cell, the at least one solar cell comprising a front side and a back side, at least two contacts on a back side of the at least one solar cell, at least a second encapsulating layer between the at least one solar cell and a conductive material and with local openings to be occupied by an electrical connection between the at least one contact and the conductive material, and at least one reflective layer disposed in the interstitial space adjacent to the at least one solar cell, the at least one reflective layer comprising a surface for redirecting light to the at least one solar cell.

DETAILED DESCRIPTION

In the following description, numerous specific details are provided, such as the identification of various components, to provide an understanding of embodiments of the invention. One skilled in the art will recognize, however, that embodiments of the invention can be practiced without one or more of the specific details, or with other methods, components, materials, etc. In still other instances, well-known structures, materials, or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

A reflective system is directed to capturing part or all of the light incident on the inactive areas by reflecting the light at angles higher than the so-called critical angle of the glass/air interface of the front glass. The light reflected at angles above the critical angle can preferably undergo the total internal reflection, which allows the re-addressing of the reflected light on the active areas with lower losses (caused by the partial transmission in the air at the glass/air interface and the absorption of glass and encapsulating materials).

FIG. 1 shows a side view of a structure for a back contact PV module. The back contact PV module of FIG. 1 includes a transparent front glass that acts as support, as well as mechanical and environmental protection for the cells 10. A layer of transparent encapsulating material 20 may be made from EVA, silicone, or polyolefins. The module further includes solar cells with both electrical contacts on the rear side 34, a second layer of encapsulating material 40 opened locally to allow the electrical connection, a sheet of conductive material 60 patterned 90 to establish an electrical connection between the solar cells, electrically conductive adhesive or solder paste 50 applied locally between the electrical contacts of the cell and the conductive sheet, a layer of encapsulating material 70, and a back protective layer that may consist of a back sheet for photovoltaic modules or a glass 80. A side view of the back contact module after lamination is shown in FIG. 2.

The encapsulating layer between the cells and the sheet may provide good adhesion and electrical insulation in the area not dedicated to the electrical connection (i.e. the area not opened), in particular when further insulation layers are not applied on the cells or the conduction layers. Various encapsulants may be used in this layer, including EVA, TPU, PVB, polyolefins, silicones, and other suitable materials, and may be applied individually as a single layer or in combination as multi-layers.

The conductive layer may be made with various metals or alloys and shaped in foils with varying thicknesses, according to the electrical resistance and the current generated by the cells (thickness may range from few microns to millimeters). The dimensions of the sheets may vary from a few millimeters to dimensions greater than one meter. Conductive sheets may also have coatings that improve their electrical properties (e.g. aluminum-based conduction sheets with copper coatings to reduce contact resistance).

The conductive sheets may be patterned to create the electrical circuit that will connect the solar cells, for example by laser cutting, chemical etching, or mechanical cutting of the sheet (milling or punching).

Provided herein are several embodiments that use the internal reflection of incident light on the inactive areas through one or more reflective layers. In a preferred embodiment, the reflective layer or layers are engineered in foils to be placed below the cells. In other embodiments, the reflective layer may be placed above the cells, or a combination of above and below the cells. The reflective foils placed below the cells may provide electrical insulation, or electrical conduction, or a combination of thereof.

In an embodiment, as shown in side view in FIG. 3, a sawtooth profile 21 is used for reflection. The sawtooth profile may comprise for example the repetition of several prisms (triangular base), pyramids, or cones. Other sawtooth profile configurations may be contemplated. Alternative profiles with concave or convex reflecting faces may also be used, such as with the repetition of spheres or cylinders. The shape of the reflecting faces may be designed in accordance with the desired length of the light path 52 inside the module or the collimation area of the reflected light. In this embodiment, the angles may be selected so the reflected light 62 preferably reaches the front glass 10/air interface 12 with an angle 42 higher than the critical angle to undergo a total internal reflection. Angles equal or smaller than the critical angle are possible but less preferable since a fraction of the reflected light is transmitted in the air and not redirected toward the cells matrix. The path 52 of the reflected light is related to the thickness of the glass and the incidence angle on the glass/air interface, such that the greater the incidence angle or the glass thickness, the greater the light path and consequently the wider the inactive areas that can contribute to power generation via the total internal reflection (i.e. wider spacing between cells may be used).

In this embodiment, the reflective layers integrated in the back contact module may be made from pure metals or alloys, and may be patterned, such as with geometric shapes to provide a distribution of the total reflected light and its collimation point. The patterns may include, for example, a plurality of pyramidal structures, prismatic structures, spherical structures, conical structures, cylindrical structure, or some combination thereof.

For the embodiment of FIG. 3, the critical angle (C.A.) of the glass/air interface is related to the refractive index (R.I.) of the two mediums. A wide range of critical angles may be possible according to glass types that may be available. For example, glass that is available for use in this embodiment may include: impure flint glass R.I. 1.93-C.A. 31.31°, pure flint glass R.I. 1.62-C.A. 38.13°, impure crown glass R.I. [1,755-1.485]-C.A. [34.75°-42.34°], pure crown glass R.I. [1,54-1.50]-C.A. [40.51°-41.82°], polycarbonate R.I. 1.60-C.A. 38.69°, polyethylene terephthalate R.I. 1.5750-C.A. 39.43°, plate glass R.I. 1.52-C.A. 41.15°, low Fe sodalime (Pil) R.I. 1.53-C.A. 40.83°, low Fe sodalime (Rub85) R.I. 1.523-C.A. 41.05°,sodalime $Fe_2O_3$ 0.02 wt % (Vog16b) R.I. 1.514-C.A. 41.35°, low Fe starphire (McI09b) R.I. 1.507-C.A. 41.59°, acrylic glass R.I. 1.49-C.A. 42.13°, poly methyl methacrylate R.I. 1.4893-C.A. 42.19°, Pyrex R.I. 1.47-C.A. 42.88°, Sylgard 184 R.I. 1.4118-C.A. 45.11°, Teflon R.I. 1.35-C.A. 47.81°.

Refractive indexes depend strongly upon the frequency of light, usually the R.I. is taken at 589 nm (sodium D line).

Other suitable glass typologies may be used for this embodiment. Small variation in the refractive index may also be found in the same glass typology provided by different suppliers because the R.I. is related also to the impurities level and production method. The critical angle of the glass/air interface may range from 31.3° to 47.81° according to the chosen glass typology, and is preferably from 39.8° to 46.4° (low Fe sodalime glass), and more preferably from 39.8° to 41.69° (sodalime glass with a Fe202 concentration lower than 0.02 wt %). Smaller or larger critical angles may be possible if glasses with a R.I. above 1.93 or below 1.35 are used. According to the glass type, the suitable angles of the reflective faces can range from 19.9° to almost 90° (and from −19.9° to almost −90° according to the face orientation), with the preferred angles of this embodiment from 23.2° to almost 90° (and from −23.20° to almost −90° according to the face orientation). Several geometries may be possible according to the chosen material and the desired light path.

The reflective layer may be manufactured using various processes, including for example mechanical, chemical, or laser processes. For example, processes based on abrasive substances or media (such as sandblasting or grinding processes) may be used to shape the surface of the reflective layer, in which case part of the reflective layer may be removed to create the reflective structure.

As another example, a mechanical approach may be based on shaped rollers or punches, in which case the structure may be imprinted on the material with a consequent plastic deformation of the metal. In some embodiments, a thermal treatment may be used to recover the crystallographic defect induced by the strain. The structure may also be created through chemical etching with acidic or caustic substances. These processes may occur in both liquid and gaseous environments. Reactions mediated by a plasma source (plasma etching) may also be used in other embodiments. Laser processes may be used to structure the surface, or laser ablation may be performed with laser sources with light emission ranging from UV to infrared light.

It will be appreciated that the side of the reflective layer not exposed to direct sunlight (i.e. the side facing the rear side of the PV module) may be planar or may have a geometry altered by the shaping process (e.g. a punching process may imprint the reflective structure on both sides of the reflective layer or may imprint the reflective structure only on the front side). The roughness of the shaded areas may also be modified to increase the adhesion between the reflective layer and the encapsulation layer.

The reflective layer surface may be treated with coatings capable to improve the optical and adhesion properties. For instance, organic or inorganic coatings may be used, and refractive indexes of the coating may be higher or lower than the refractive index of the encapsulant layers. The refractive index may be chosen to optimize the reflectance of the surface.

In some embodiments, the surface of the reflective layers may be treated with additive or subtractive processes. Examples of additive processes may include for example tin or silver coatings deposited by electrochemical, chemical, evaporation, sputtering, screen printing, liquid (melted metal), or solid phase deposition (cold spray of metal particles). A coating uniformly deposited may be selectively removed.

The deposited coatings may be treated with thermal, electrochemical, chemical or laser processes.

In the embodiment shown in FIG. 3, the back contact module includes a reflective layer or a plurality of layers used to interconnect the cells matrix in an electrical circuit 32, enhancing the functions of the conductive layer 60 shown in FIG. 1. The reflective layer or layers used to conduct the current generated by the cells may be used with no modification to the previously described processes or with modifications to enhance the chemical and electrical characteristics, including for example solderability, electrical conductivity, or contact resistance.

It will be appreciated that the production techniques described herein may be integrated with other processes to enhance the electrical characteristics of the reflective layers used to establish an electrical connection in the cells matrix.

A coating may be selectively deposited in the areas where the electrical contact between the conductive sheet and the cell is established with the aim of reducing the contact resistance. These coatings may be composed of elements with better electrical properties, such as copper, silver, or tin for example, and deposited by various methods, including screen printing, sputtering, plating, evaporation, or cold spray (high velocity particles). A coating uniformly deposited to improve the electrical and mechanical properties may be selectively removed in the areas exposed to sunlight if its optical properties are not suitable for light reflection (e.g. aluminum foils coated with copper only on the contacts area, in the areas exposed to sunlight the aluminum surface is exposed to increase the reflectivity). The deposited coatings may be treated with various processes, including thermal, electrochemical, chemical or laser processes, to improve the coating's mechanical, electrical, and optical properties.

The electrical connection between the cells and the conductive sheet may be established by means of electroconductive glues (ECA) or soldering pastes, or various other techniques. For example, laser processes may also be used to induce the melting of the soldering paste or the direct welding between the conductive sheet and the cell. The welding processes may be mediated by ultrasonic acoustic vibration to promote the welding of not easily weldable metals (e.g. aluminum). In some embodiments, the conductive sheet may also be supplied as a stand-alone solution or coupled with the insulating dielectric layer, a backsheet, or a glass, or combinations of thereof. The conductive sheet may also be supplied with or without the electric pattern, in which case the electric circuit may be created before the assembly of the photovoltaic module.

FIG. 4 shows another embodiment wherein the proposed back contact module uses a reflective layer 16, or a plurality of thereof, embodied in between the cells matrix 34 and the connecting electrical circuit 32 (i.e. the position usually occupied by the insulation layer 70 depicted in FIG. 1). The reflecting sheet may be present on the whole surface of the module (except where it is drilled to allow the electrical connection between cells and conductive sheet 36) or it may only be present in some specific areas of the module.

In the embodiments of the present invention, electrical conduction is not required, so the limitations related to the electrical conduction (i.e. sufficient conductibility and cross section) may be avoided.

It will be appreciated that the reflective layer or layers of the embodiments of the invention may be provided individually or coupled with one or several encapsulation layers.

If the reflective layers are provided individually, the thickness is preferably thick enough (according to the metal or alloy used) to allow the handling of the layers. If coupled with at least one encapsulation layer, the thickness of the reflective layers may be considerably decreased. Metals or alloys characterized by a high reflectivity but at the same time a lack of electrical properties (good conductivity and low contact resistance) may be used to produce this type of reflective layer. Metals or alloys with a higher cost may be used thanks to the reduced thickness allowed by coupled reflective layers (i.e. thicknesses from a few nanometers to tens of microns).

Aluminum is an example of a metal that may not be suitable to electrical conduction due to the lower conductivity than copper and the presence of a layer of native oxide on the surface that increases its contact resistance. Other examples may include chromium and nickel. A reflective sheet of aluminum can be produced with a reduced thickness and without surface treatments capable to reduce the contact resistance. Silver is an example of a metal with good optical properties, but at higher costs.

As large thicknesses or high conductivity are not necessary may not be necessary with embodiments where the reflective layer is coupled to an encapsulation layer, alternative production processes to those described above can be used.

In some embodiments, a metal layer may be evaporated on the surface of the encapsulating sheet. The reflecting structure may be created on the surface of the encapsulating layer before the evaporation of the metal or in the phases subsequent to evaporation. For the structuring of the encapsulating surface, the above described techniques may be used.

FIG. 5 shows another embodiment of a back contact module wherein a reflective layer 516 or a plurality of layers are coupled or deposited on a polymeric substrate 24 or substrates (organic or inorganic polymer) placed in specific areas above the cells matrix 534.

FIG. 6 shows a further embodiment of a back contact module wherein a reflective layer 616 or a plurality of layers are coupled or deposited on a polymeric substrate 24 or substrates (organic or inorganic polymer) placed in specific areas below the cells matrix 634. The obtained coupled foil may be used in replacement or combination with the insulation layer used in back contact modules (as element 40 in FIG. 1). Encapsulating polymers may also be used to produce the coupled foil to provide a mechanical support for the reflective layers and adhesion between the cells matrix 634 and the electrical circuit 32.

In this embodiment, a reflective layer, or a plurality of reflective layers, may be placed in specific areas with a width comparable to the distance between the solar cells and a spacing that corresponds to areas not to be occupied by the cells. During the assembly of the solar module of this embodiment, the cells are placed in the areas between the reflective layers allowing total internal reflection on the separation areas between cells. The reflective sheet may be divided into strips or sheets of various sizes and geometric shapes. For example, the sub units may be in the form of a square, rectangle, rectangle, pentagon, hexagon, or octagon shape. The arrangement and the spacing of the matrix may be varied according to the shape of the cells and the desired spacing. A matrix or array of these reflecting subunits may also be coupled with one or several polymeric layers.

In other embodiments, the same matrix may be obtained through the evaporation of the metal on polymeric layer or layers, and a mask may be used to avoid the metal deposition on specific areas or to avoid the removal of the metal layer in some specific areas if removal processes are used. Alternatively, the metal may be selectively deposited in the desired areas only.

FIG. 7 shows a further embodiment of a back contact module wherein the reflecting layer 716 placed above the cells matrix 734 may be used alternatively or in combination with the conductive layer 36 with total internal reflection capability.

FIG. 8 is a front view of the embodiment shown in FIG. 7. Using combinations of the two reflecting layers 16, the direction of reflection may be varied on the surface of the module without increasing the complexity of the reflecting geometry. Using the same reflecting pattern but overlapping the reflective layers at 90° angle, the light may be reflected along the X or Y direction of the module plane (depending on whether the light hits the layer at 00 or the layer at 90) and readdressed to all the sides of a square-shaped cell 38. Different combinations of intersecting angles may be used depending on the shape of the used cells.

FIG. 9 shows a further embodiment of a back contact module wherein the reflecting layer 916 placed below the cells matrix 934 may be used alternatively or in combination with the conductive layer 36 with total internal reflection capability.

In other embodiments, several metal layers may be alternated with encapsulating layers. The reflective geometry of each additional layer may be modified or oriented to change the direction of the reflected light along the X and Y plane of the solar module.

The embodiments described herein preferably capture part of the light incident on the inactive areas of a PV module by reflecting the light by means of, for example, the scattering phenomenon at angles higher than the so-called critical angle of the glass/air interface of the front glass. The light reflected at angles above the critical angle preferably undergoes total internal reflection, which allows the re-addressing of the reflected light on the active areas with lower losses (caused by partial transmission in the air at the glass/air interface and the absorption of glass and encapsulating materials).

Solar cells with both electrically active sides may be used to further compensate the higher initial cost of the glass-glass solution. In traditional PV modules, light is converted into electricity by the front side (sunny side), while the PV modules known as bifacial modules may generate electricity also in the rear side. Whereas traditional solar modules convert only direct light, bifacial modules may convert also the indirect "albedo" light reflected from the surrounding environment to the back side of the module. The transparency of the back glass and the presence of bifacial cells may allow the module to collect more light, increasing the productivity of the bifacial module. In PV modules with white back sheets, the internal reflection is emphasized, but in glass-glass modules this effect is less effective when transparent encapsulants and glass layers are used (fundamental for the generation of the rear side).

FIG. 10 shows a side view of a PV module. The PV module of FIG. 10 includes a transparent front glass 110 that acts as support, as well as mechanical and environmental protection for the cells. A layer of transparent encapsulating material 120 may be made from EVA, silicone, or polyolefins. The module further includes solar cells 130 with electrical contacts on both sides, conductive ribbons or wires 140 150 interconnecting solar cells (herein shown the side view of the ribbons, the cross section of ribbons and wires is smaller and shades a small area on the solar cells), a second layer of encapsulating material 160 and a back protective layer composed of several layers of polymeric materials 170. A side view of the PV module after lamination is shown in FIG. 11.

This structure is the most commonly used solution, as it allows to reach a good compromise between production costs and durability of PV modules.

Provided herein are several embodiments that use the internal reflection of incident light on the inactive areas through one or more reflective interfaces. In some embodiments, the reflective interfaces may be placed on the inner or outer surface of the encapsulation glasses or a combination of thereof. Front glass or rear glass or a combination of thereof, in addition to enhancing the mechanical and environmental protection to the solar cells, may also act as a solar reflector in areas not shaded by solar cells.

In another preferred embodiment, as shown in side view in FIG. 12, a reflective interface 112 with a sawtooth profile is placed on the inner surface of the rear glass 126. The light incident on the solar cell 142 is directly absorbed and converted. The light incident on the inactive areas 132 is reflected by the reflective interface 112. The sawtooth profile may comprise for example the repetition of several prisms (triangular base), pyramids, or cones. Alternative profiles with concave or convex reflecting faces may also be used, such as with the repetition of spheres or cylinders. The shape of the reflecting faces may be designed in accordance with the desired length of the light path 134 inside the module or the collimation area of the reflected light. In this embodiment, the angles may be selected so the reflected light 131 preferably reaches the front glass/air interface 121 with an angle 133 higher than the critical angle in order to undergo a total internal reflection. Angles equal or smaller than the critical angle are possible but less preferable since a fraction the reflected light is transmitted in the air and not redirected toward the cells matrix. The path 134 of the reflected light is related to the thickness of the glass and the incidence angle on the glass/air interface, the greater the incidence angle or the glass thickness, the greater the light path and consequently the wider the inactive areas that can contribute to power generation via the total internal reflection (i.e. wider spacing between cells can be used).

For the embodiment of FIG. 12, the critical angle (C.A.) of the glass/air interface is related to the refractive index (R.I.) of the two mediums. A wide range of critical angles may be possible according to glass types that may be available. For example, glass that is available for use in this embodiment may include: impure flint glass R.I. 1.93-C.A. 31.31°, pure flint glass R.I. 1.62-C.A. 38.13°, impure crown glass R.I. [1,755-1.485]-C.A. [34.75°-42.34°], pure crown glass R.I. [1,54-1.50]-C.A. [40.51°-41.82°], polycarbonate R.I. 1.60-C.A. 38.69°, polyethylene terephthalate R.I. 1.5750-C.A. 39.43°, plate glass R.I. 1.52-C.A. 41.15°, low Fe sodalime (Pil) R.I. 1.53-C.A. 40.83°, low Fe sodalime (Rub85) R.I. 1.523-C.A. 41.05°, low Fe starphire (McI09b) R.I. 1.507-C.A. 41.59°, sodalime $Fe_2O_3$ 0.02 wt % (Vog16b) R.I. 1.514-C.A. 41.35°, acrylic glass R.I. 1.49-C.A. 42.13°, poly methyl methacrylate R.I. 1.4893-C.A. 42.19°, Pyrex R.I. 1.47-C.A. 42.88°, Sylgard 184 R.I. 1.4118-C.A. 45.11°, Teflon R.I. 1.35-C.A. 47.81°.

Refractive indexes depend strongly upon the frequency of light, usually the R.I. is taken at 589 nm (sodium D line).

Other suitable glass typologies may be used for this embodiment. Small variation in the refractive index may also be found in the same glass typology provided by different suppliers because the R.I. is related also to the impurities level and production method.

The critical angle of the glass/air interface may range from 31.3° to 47.81° according to the chosen glass typology and is preferably from 39.8° to 46.4° (low Fe sodalime glass) and more preferably from 39.8° to 41.69° (sodalime glass with a Fe2O2 concentration lower than 0.02 wt %). Smaller or larger critical angles may be possible if glasses with a R.I. above 1.93 or below 1.35 are used.

According to the glass type, the suitable angles of the reflective faces may range from 19.9° to almost 90° (and from −19.9° to almost −90° according to the face orientation), with the preferred angles of this embodiment from 23.2° to almost 90° (and from −23.20° to almost −90° according to the face orientation). Several geometries may be possible according to the chosen material and the desired light path.

The structure may be imprinted on the glass with shaped rollers or punches at temperatures above the softening point of the glass. Processes based on abrasive substances or media (such as sandblasting or grinding processes) may be used to shape the surface of the glass.

The structure may be created through chemical attacks with acidic substances (e.g. hydrofluoric acid) or caustics (e.g. sodium or potassium hydroxide). These processes may occur in both liquid and gaseous environments. With gaseous environments, reactions mediated by a plasma source (plasma etching) may be used.

If the surface is not treated, reflection is only possible on the external surfaces, where the passage from a dense medium (glass) to a less dense (air) allows the total internal reflection.

The reflecting surface may be treated with coating that improves its optical and adhesion properties.

In the embodiment of FIG. 12, the use of a reflective coating 116 allows greater flexibility in the definition of the reflecting structure, being no longer limited by the formation of critical angles but depending only on geometric factors. With a reflective coating, it is possible to change the reflection angle and increase or decrease the light path inside the glass.

The reflective coating may be deposited using various techniques. A magnetron metal layer may be deposited after glass production. This type of coating is commonly referred to as soft coating. An alternative solution may be the pyrolytic coating or hard coating, which is deposited during the production of the glass and has a greater resistance to abrasion and atmospheric agents.

Other deposition techniques involve the evaporation of metals on the glass surface or the deposition through chemical reactions. Metal-based screen printing pastes may be used, and may be printed with several technologies (including by way of example ink jet or screen printing) and fixed on the glass through thermal processes.

Reflective layers may be deposited using the sputtering technique, wherein the atoms to be deposited are accelerated by using electric fields and collided with the surface to be covered.

Reflective layers may be deposited with the cold spray technique, wherein metal particles are accelerated at high speed using compressed air systems and made to collide with the surface to be covered.

The reflecting coating may be selectively deposited or uniformly deposited and selectively removed using masks or selective depositions of pastes.

The formation of the reflective structure may affect the entire surface of the glass or specific areas.

FIG. 13 shows another embodiment wherein a reflective interface 270 is placed on specific areas of the inner surface of the rear glass 220. The surface of the glass in the areas without reflective interface may retain the sawtooth structure 280. The light incident on the solar cell 240 is directly absorbed and converted, while the light incident on the inactive areas 230 is absorbed and converted after total internal reflection. In bifacial modules the reflecting structure may be induced only in the areas between the cells 210 and between the cells and the edge, not interfering the absorption of the direct albedo light 250 or the internally reflected albedo light 260. The direct albedo light is slightly affected by the encapsulant/glass interface 290 because usually the refractive indexes of the two materials are similar, thus the sawtooth structure (if retained) doesn't considerably divert the light.

FIG. 14 shows another embodiment wherein the inner surface of the rear glass has a flat or pseudo flat profile in the areas without reflective interface 290.

FIG. 15 shows another embodiment wherein a reflective interface 310 is placed on the outer surface of the rear glass 320. The light reflected by the reflective interface 330 may travel for a longer path than the embodiment illustrated in FIG. 13, because the reflected light travels inside the rear and front glass. Light reflected by the reflective interface may be absorbed on the front side of the cell 335 or the rear side of the cell 340 if a bifacial cell is used.

FIG. 16 shows another embodiment wherein a reflective interface is placed on specific areas 470 on the outer surface of the rear glass 420. The surface of the glass in the areas without reflective interface may have a flat or pseudo flat surface 480. The light incident on the solar cell is directly absorbed and converted, while the light incident on the inactive areas 430 is absorbed and converted on the front surface (after total internal reflection) and on the rear surface 440 if bifacial cells are used. In bifacial modules the reflecting structure may be induced only in the areas between the cells 460 and between the cells and the edge, not interfering the absorption of the direct albedo light 450. Unlike the embodiment illustrated in FIG. 13 and FIG. 14, the albedo light incident on the inactive area is lost (it's reflected on the outer surface of the rear glass).

FIG. 17 shows another embodiment wherein the outer surface of the glass retains the sawtooth structure in the areas without reflective interface 580. With a sawtooth structure the collection of the albedo light at big incident angles is improved 590 because the incident angle on the tilted surface is smaller than the incident angle on a flat surface.

FIG. 18 shows another embodiment wherein a reflective interface is placed on specific areas 570 of the inner surface of the front glass 520. The surface of the glass in the areas without reflective interface may retain the sawtooth structure 585. The light incident on the solar cell 540 is directly absorbed and converted, while the light incident on the inactive areas 530 is absorbed and converted after total internal reflection. In bifacial modules, the direct albedo light 550 and the albedo light incident on the inactive areas 560 is absorbed and converted. The reflective interface placed on the inner surface of the front glass may collect the light otherwise incident on the electrical connections 521. If the reflective layer is placed on the rear glass or it's not present at all, the light incident on the electrical connections may be reflected with an angle significantly smaller than the critical angle and mostly transmitted on the glass/air interface rather than reflected. The reflective interface on the inner surface may also improve the aesthetic of the PV module, because the electrical connections between adjacent cells are covered by the reflective layer, providing a PV module aesthetically more homogeneous.

FIG. 19 shows another embodiment wherein the inner surface of the front glass has a flat or pseudo flat profile in the areas without reflective interface 680.

FIG. 20 shows another embodiment wherein the inner surface of the front glass has a flat or pseudo flat profile in the areas without reflective interface 680 and a polymeric back sheet 690 is used as rear encapsulant layer. A polymeric back sheet doesn't affect the collection of the light of the inactive areas and decreases the production costs at expense of the durability. The polymeric back sheet may be white or may be black or may be transparent. In the last case the direct albedo light 650 can be absorbed by bifacial cells and the albedo light incident on the inactive areas 660 is almost completely lost, since the polymeric back sheet is usually thinner than a rear glass and the optical path of the albedo light is consequently shortened.

FIG. 21 shows another embodiment wherein a reflective interface is placed on specific areas 670 of the inner surface of the front glass 620. The surface of the glass in the areas without reflective interface may retain the sawtooth structure 685 and a polymeric back sheet 690 is used as rear encapsulant layer.

It should be understood that steps or the order of the steps described herein may be altered, modified and/or augmented and still achieve the desired outcome. Further, the various features and adaptations described in respect of one example or embodiment in this disclosure can be used with other examples or embodiments described herein, as would be understood by the person skilled in the art.

A portion of the disclosure of this patent document contains material which is or may be subject to one or more of copyright, design, or trade dress protection, whether registered or unregistered. The rights holder has no objection to the reproduction of any such material as portrayed herein through facsimile reproduction of this disclosure as it appears in the Patent and Trademark Office records, but otherwise reserves all rights whatsoever.

As used herein, the terms "comprises", "comprising", "includes", "including", "has", "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Throughout the specification, terms such as "may" and "can" are used interchangeably. Use of any particular term should not be construed as limiting the scope or requiring experimentation to implement the claimed subject matter or embodiments described herein.

Further, while the specification may have articulated specific technical problems that are addressed by the invention(s), the disclosure is not intended to be limiting in this regard; the person of ordinary skill in the art will readily recognize other technical problems addressed by the invention(s). Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the present specification, including definitions, will control. In addition, the materials, methods, and examples are illustrative only and not intended to be limiting.

The invention claimed is:

1. A photovoltaic module comprising:
    a front surface comprised of a transparent front support layer,
    a back surface comprised of a back protective layer,
    at least an encapsulating layer between the transparent front support layer and at least one solar cell,
    the at least one solar cell comprising a front side and a back side,
    the back side comprising at least one positive electrical contact and at least one negative electrical contact,
    at least a second encapsulating layer between the at least one solar cell and a conductive material and with local openings to be occupied by an electrical connection between at least one positive electrical contact or the at least one negative electrical contact and the conductive material,
    at least one reflective layer disposed below the at least one solar cell and at least partially below the space adjacent to the at least one solar cell, the at least one reflective layer comprising a surface for redirecting light to the at least one solar cell,
    wherein at least a portion of the at least one reflective layer is overlapping with and facing the backside of the at least one solar cell,
    wherein the at least one reflective layer is coupled with at least one polymeric layer to provide insulation between the at least one solar cell and the electrical connection.

2. The photovoltaic module of claim 1, wherein the surface of the at least one reflective layer for redirecting light indirectly to the at least one solar cell is coupled to at least a portion of the conductive material.

3. The photovoltaic module of claim 2, wherein the surface of the at least one reflective layer is patterned with a plurality of structures.

4. The photovoltaic module of claim 1, wherein the at least one reflective layer comprises an inorganic coating.

5. The photovoltaic module of claim 1, wherein the at least one reflective layer comprises an organic coating.

6. The photovoltaic module of claim 1, wherein the at least one reflective layer is a metallic layer.

* * * * *